United States Patent
Liu et al.

(10) Patent No.: US 10,382,018 B2
(45) Date of Patent: *Aug. 13, 2019

(54) FLIP FLOP CIRCUIT AND METHOD OF OPERATING THE SAME

(71) Applicant: TAIWAN SEMICONDUCTOR MANUFACTURING COMPANY, LTD., Hsinchu (TW)

(72) Inventors: Chi-Lin Liu, New Taipei (TW); Shang-Chih Hsieh, Yangmei (TW); Lee-Chung Lu, Taipei (TW); Chang-Yu Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/443,504

(22) Filed: Feb. 27, 2017

(65) Prior Publication Data

US 2017/0170811 A1 Jun. 15, 2017

Related U.S. Application Data

(63) Continuation of application No. 14/539,407, filed on Nov. 12, 2014, now Pat. No. 9,584,099.

(51) Int. Cl.
  *H03K 3/356* (2006.01)
  *G01R 31/3185* (2006.01)
  *H03K 3/037* (2006.01)

(52) U.S. Cl.
  CPC ........... *H03K 3/356104* (2013.01); *G01R 31/318541* (2013.01); *H03K 3/037* (2013.01); *H03K 3/356121* (2013.01)

(58) Field of Classification Search
  CPC ...................................... H03K 3/356
  See application file for complete search history.

(56) References Cited

U.S. PATENT DOCUMENTS 6,081,153 A  6/2000  Hamada et al.
6,630,853 B1 10/2003  Hamada
(Continued)

FOREIGN PATENT DOCUMENTS

JP  2007-170822  7/2007
JP  2007-248381  9/2007
KR  1999-023870  3/1999

OTHER PUBLICATIONS

Notice of Allowance dated Jun. 29, 2016 and English translation from corresponding No. KR 10-2014-0184727.

*Primary Examiner* — Hai L Nguyen
(74) *Attorney, Agent, or Firm* — Hauptman Ham, LLP (57) ABSTRACT

A flip-flop circuit includes a first latch, a second latch and a trigger circuit. The first latch is configured to set a first output signal based on a first input signal and a clock signal. The second latch is configured to set a second output signal based on a second input signal and the clock signal. The trigger circuit is coupled with the first latch and the second latch. The trigger circuit is configured to generate the second input signal based on at least the second output signal. The trigger circuit is configured to cause the second input signal to have different voltage swings based on the first output signal and the second output signal. The trigger circuit includes a logic circuit coupled to at least the first latch or the second latch. The logic circuit is configured to output the second output signal.

20 Claims, 10 Drawing Sheets

(56) References Cited

U.S. PATENT DOCUMENTS

| | | |
|---|---|---|
| 6,938,225 B2 | 8/2005 | Kundu |
| 7,242,235 B1 | 7/2007 | Nguyen |
| 7,420,391 B2 | 9/2008 | Pesci |
| 7,994,836 B2 * | 8/2011 | Hart .................. H03K 3/35625 327/208 |
| 9,356,583 B2 | 5/2016 | Liu |
| 9,584,099 B2 * | 2/2017 | Liu ....................... H03K 3/037 |
| 2007/0226560 A1 | 9/2007 | Uchida |
| 2009/0212815 A1 | 8/2009 | Pitkethly et al. |

\* cited by examiner

FLIP FLOP CIRCUIT AND METHOD OF OPERATING THE SAME

PRIORITY CLAIM

The present application is a continuation of U.S. application Ser. No. 14/539,407, filed Nov. 12, 2014, now U.S. Pat. No. 9,584,099 B2, issued on Feb. 28, 2017, which is incorporated herein by reference in its entirety.

RELATED APPLICATIONS

The present application relates to U.S. patent application Ser. No. 14/472,937, filed on Aug. 29, 2014, now U.S. Pat. No. 9,356,583 B2, issued on May 31, 2016, titled "FLIP FLOP CIRCUIT," and the disclosure of which is incorporated herein by reference in its entirety.

BACKGROUND

In silicon-on-chip (SOC) designs, flip-flop circuits such as D-type flip-flops (DFFs) or scan DFFs (SDFFs and also referred to as scan flip-flops) are used to perform desired functions of a circuit design. For example, scan chains that comprise a plurality of interconnected scan flip-flops are used to obtain access to internal nodes of an integrated circuit (IC) to simplify testing of the IC by passing test data through the scan flip-flops. The scan flip-flop is configured to operate in one of two modes, data mode and scan mode. When a scan enable signal (assumed active high) of a scan flip-flop is set to a low logical value, the scan flip-flop is in the data mode. When the scan enable signal of the scan flip-flop is set to a high logical value, the scan flip-flop is in scan mode. For a full scan design, during scan testing, all of the flip-flops and all of the combinational logic connected to the flip-flops, may be toggling at the same time, causing relatively high power consumption. This high power consumption may exceed the circuit's power rating as IC chip density and speed increase.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a flip-flop circuit includes a trigger stage that is configured to set an output signal of the trigger stage to have two different voltage swings responsive to a stored value of the flip-flop circuit. Compared with a counterpart flip-flop circuit that does not adjust the voltage swing of the output signal of the trigger stage, the flip-flop circuit according to the present application consumes less power when more transistors are subject to be toggled responsive to a clock signal.

Figure 1:
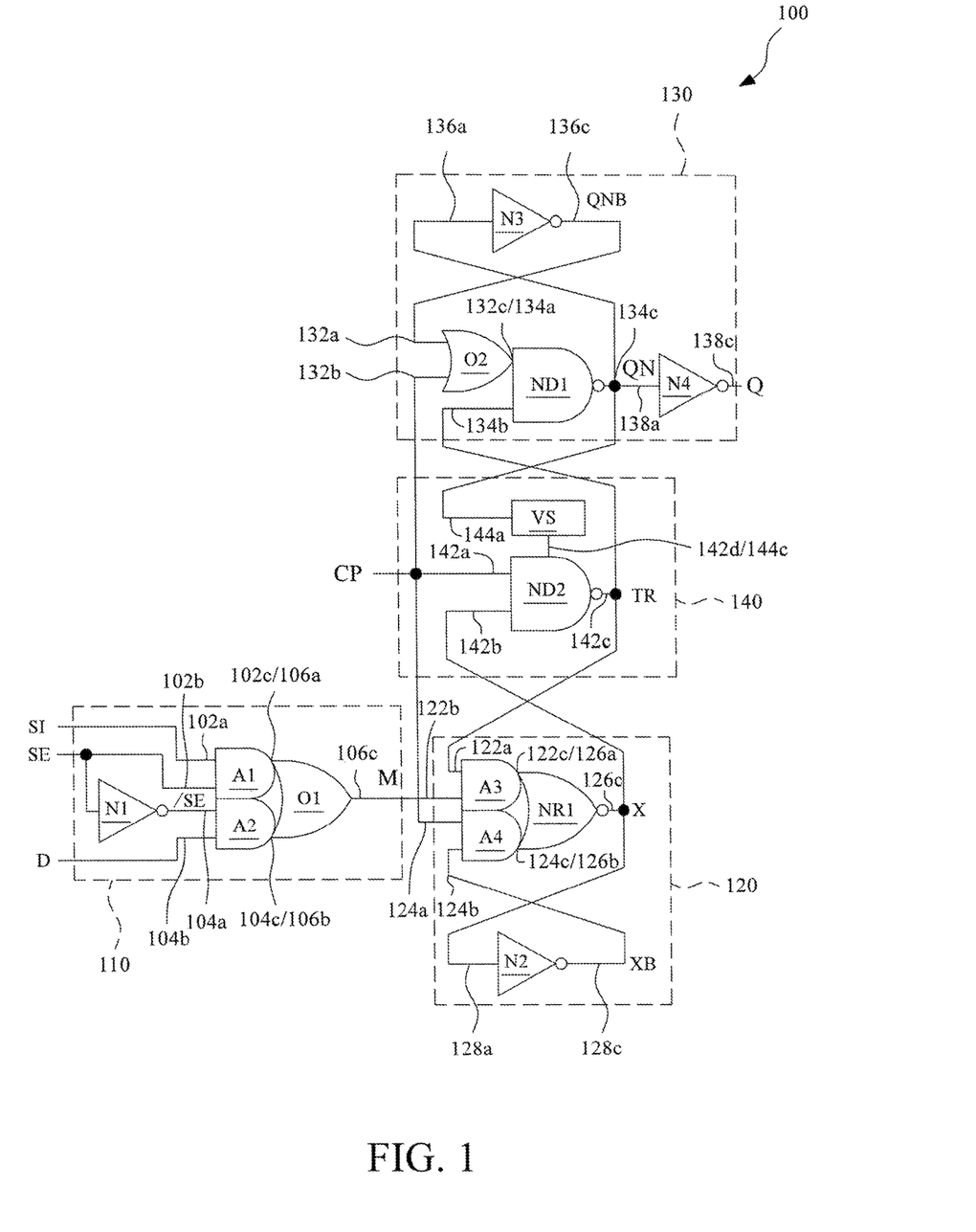
FIG. 1 is a circuit diagram of a flip-flop circuit in accordance with some embodiments.

FIG. 1 is a circuit diagram of a flip-flop circuit 100 in accordance with some embodiments. Flip-flop circuit 100 includes an input stage 110, a first latch 120 coupled with input stage 110, a second latch 130, and a trigger stage 140 coupled with the first latch 120 and the second latch 130.

Input stage 110 is configured to select one of a plurality of input signals, such as a scan input signal SI or a data input signal D, in response to a scan enable signal SE and output a signal M for first latch 120 based on the selected signal. Input stage 110 includes an inverter N1, two AND gates A1 and A2, and an OR gate O1. Inverter N1 receives signal SE and output signal/SE, which is logically complementary to signal SE. AND gate A1 includes a first input 102a, a second input 102b, and an output 102c. The first input 102a of AND gate A1 receives signal SI, and the second input 102b of AND gate A1 receives signal SE. AND gate A2 includes a first input 104a, a second input 104b, and an output 104c. The first input 104a of AND gate A2 receives signal/SE, and the second input 104b of AND gate A2 receives signal D. OR gate O1 includes a first input 106a, a second input 106b, and an output 106c. The first input 106a of OR gate O1 is coupled with the output 102c of AND gate A1, and the second input 106b of OR gate O1 is coupled with the output 104c of AND gate A2. The output 106c of OR gate O1 is coupled with first latch 120.

When the flip flop 100 is operated in a first mode, signal SE is set to have a high logical value. AND gate A2 outputs a low logical value, irrespective of the logic state of signal D. The output 106c of OR gate O1 thus depends on signal SI. When signal SI is logically high, the output 106c of OR gate O1 is also logically high. When signal SI is logically low, the output 106c of OR gate O1 is also logically low. As a result, when signal SE is logically high, signal M has a logical state the same as that of signal SI.

When the flip flop 100 is operated in a second mode, signal SE is set to have a low logical value. AND gate A1 outputs a low logical value, irrespective of the logic state of signal SI. The output 106c of OR gate O1 thus depends on signal D. When signal D is logically high, the output 106c of OR gate O1 is also logically high. When signal D is logically low, the output 106c of OR gate O1 is also logically low. As a result, when signal SE is logically low, signal M has a logical state the same as that of signal D.

In the present embodiment, the flip-flop circuit 100 is usable as a scan flip-flop, where the first mode is also referred to as a "scan mode" and the second mode is also referred to as a "data mode." In some embodiments, the flip-flop circuit 100 is usable as a non-scan flip-flop, where input stage 110 is omitted, and data input signal D is directly fed to node M.

First latch 120 is configured to set a first latch output signal X based on signal M (also referred to as "first latch input signal") and a clock signal CP. The first latch 120 updates a logical state of the first latch output signal X based on the first latch input signal M in response to a first state of clock signal CP and holds the logical state of the first latch output signal X in response to a second state of clock signal CP. In some embodiments, the first state and the second state of clock signal CP are logically complementary to each other. In some embodiments, the first state of clock signal CP refers to a low logical value, and the second state of clock signal CP refers to a high logical value.

First latch 120 includes two AND gates A3 and A4, a NOR gate NR1, and an inverter N2. AND gate A3 includes a first input 122a, a second input 122b, and an output 122c. The first input 122a of AND gate A3 is coupled with trigger stage 140. The second input 122b of AND gate A3 is coupled with the output 106c of OR gate O1 and configured to receive signal M. AND gate A4 includes a first input 124a, a second input 124b, and an output 124c. The first input 124a of AND gate A4 is configured to receive clock signal CP. NOR gate NR1 includes a first input 126a, a second input 126b, and an output 126c. The first input 126a of NOR gate NR1 is coupled with the output 122c of AND gate A3. The second input 126b of NOR gate NR1 is coupled with the output 124c of AND gate A4. The output 126c of NOR gate NR1 is coupled with the trigger stage 140 and carries signal X. Inverter N2 has an input 128a and an output 128c. The input 128a of inverter N2 is coupled with the output 126c of NOR gate NR1, and the output 128c of inverter N2 is coupled with the second input 124b of AND gate A4.

Second latch 130 is configured to set a second latch output signal QN based on a signal TR (also referred to as "second latch input signal") and clock signal CP. Second latch 130 is also configured to output a signal Q based on signal QN. The second latch 130 updates a logical state of the second latch output signal QN based on the second latch input signal TR in response to the second state of clock signal CP and holds the logical state of the second latch output signal QN in response to the first state of clock signal CP.

Second latch 120 includes an OR gate O2, a NAND gate ND1, and two inverters N3 and N4. OR gate O2 includes a first input 132a, a second input 132b, and an output 132c. The second input 132b of OR gate O2 is configured to receive clock signal CP. NAND gate ND1 includes a first input 134a, a second input 134b, and an output 134c. The first input 134a of NAND gate ND1 is coupled with the output 132c of OR gate O2. The second input 134b of NAND gate ND1 is configured to receive signal TR. The output 134c of NAND gate ND1 carries signal QN. Inverter N3 has an input 136a and an output 136c. The input 136a of inverter N3 is coupled with the output 134c of NAND gate ND1, and the output 136c of inverter N3 is coupled with the first input 132a of OR gate O2. Inverter N4 has an input 138a and an output 138c. The input 138a of inverter N4 is coupled with the output 134c of NAND gate ND1, and the output 138c of inverter N4 carries signal Q.

Trigger stage 140 is configured to generate second latch input signal TR based on clock signal CP, first latch output signal X, and second latch output signal QN. Trigger stage 140 is also configured to cause second input signal TR to have two different voltage swings based on second latch output signal QN. In some embodiments, second input signal TR has a first voltage swing in response to a first state of second latch output signal QN and a second voltage swing in response to a second state of second latch output signal QN, where the second voltage swing is less than the first voltage swing. In some embodiments, the first state of signal QN refers to a low logical value, and the second state of signal QN refers to a high logical value. In some embodiments, a high voltage level and a low voltage level of the second voltage swing are still recognizable by AND gate A3 and NAND gate ND1 as corresponding to the high logical value and the low logical value, respectively.

Trigger stage 140 includes a NAND gate ND2 and a voltage setting circuit VS. NAND gate ND2 includes a first input 142a, a second input 142b, an output 142c, and a adjustable power node 142d. The first input 142a of NAND gate ND2 is configured to receive clock signal CP. The second input 142b of NAND gate ND2 is coupled with the output 126c of NOR gate NR1 and configured to receive signal X. The output 142c of NAND gate ND2 carries signal TR. Voltage setting circuit VC includes an input node 144a and an output node 144c. The input node 144a of voltage setting circuit VC is coupled with output node 134c of NAND gate ND1 and configured to receive signal QN. The output node of voltage setting circuit VC is coupled with adjustable power node 142d of NAND gate ND2.

In some embodiments, voltage setting circuit VC sets a voltage at the output node 144c of the voltage setting circuit VC to have a first power supply voltage level in response to the first state of signal QN and a second power supply voltage level in response to the second state of signal QN. In some embodiments, the second power supply voltage level is less than the first power supply voltage level.

In operation, NAND gate ND2 sets signal TR at a high logical value when clock signal has a low logical value and sets signal TR to have the logical value complementary to that of signal X when clock signal has a high logical value. In some embodiments, the high logical value of TR corresponds to the first power supply voltage level when signal X has a low logical value regardless the logical state of signal QN; and the high logical value of TR corresponds to the second power supply voltage level when signal X has a high logical value and signal QN has a low logical value.

With respect to first latch 120, inverter N2 set signal XB to be logically complementary to signal X (i.e., "/X"). When clock signal CP is logically low, signal TR is logically high. As such, AND gate A4 outputs a low logical value and AND gate A3 outputs a logical value the same as that of signal M. NOR gate NR1 thus sets signal X to have a logical value complementary to the logical value of signal M. On the other hand, when clock signal CP is logically high, signal TR has a logical value complementary to that of signal X and the same as that of signal XB. As such, AND gate A4 outputs a logical value the same as that of signal XB and AND gate A3 outputs either the low logical value or a logical value the same as that of signal XB. NOR gate NR1 thus sets signal X to have a logical value complementary to the logical value of signal XB.

With respect to second latch 130, inverter N3 sets signal QNB to be logically complementary to signal QN (i.e., "/QN"), and inverter N4 sets signal Q to be logically complementary to signal QN. When clock signal CP is logically high, signal TR has a logical value complementary to that of signal X. As such, OR gate O2 outputs the high logical value. NAND gate ND1 thus sets signal QN to have a logical value complementary to the logical value of signal TR. On the other hand, when clock signal CP is logically low, signal TR is logically high. As such, OR gate O2 outputs a logical value the same as that of signal QNB. NAND gate ND1 thus sets signal QN to have a logical value complementary to the logical value of signal QNB.

Operation of flip-flop circuit 100 is summarized in Table 1 below.

TABLE 1

| CP | TR | /X (or XB) | /QN (or Q) |
|---|---|---|---|
| LOW | HIGH | M (update) | the previously stored value (hold) |
| HIGH | /X (updated based on M when CP = LOW) | the previously stored value (hold) | TR (update) |

As presented in Table 1, when signal M remains logically low for a plurality of clock cycles of clock signal CP, signal QN remains logically high and signal X remains logically high. However, signal TR is logically high when clock signal CP is logically low and signal TR is logically low when clock signal CP is logically high. As a result, transistors of NAND gate ND1 and AND gate A3 are being toggled although the logical values of signals M, X, and Q remain unchanged. Under this scenario, voltage setting circuit VS sets the signal TR to have a lowered voltage swing in response to the high logical value of signal QN when signal X has a logical high value, and the power consumption of trigger stage 140 is thus reduced. Compared with a configuration in which signal TR does not have the lowered voltage swing, when signal QN is logically high and signal X has a logical high value, flip-flop circuit 100 consumes about 20% to 30% less power.

Figure 2:
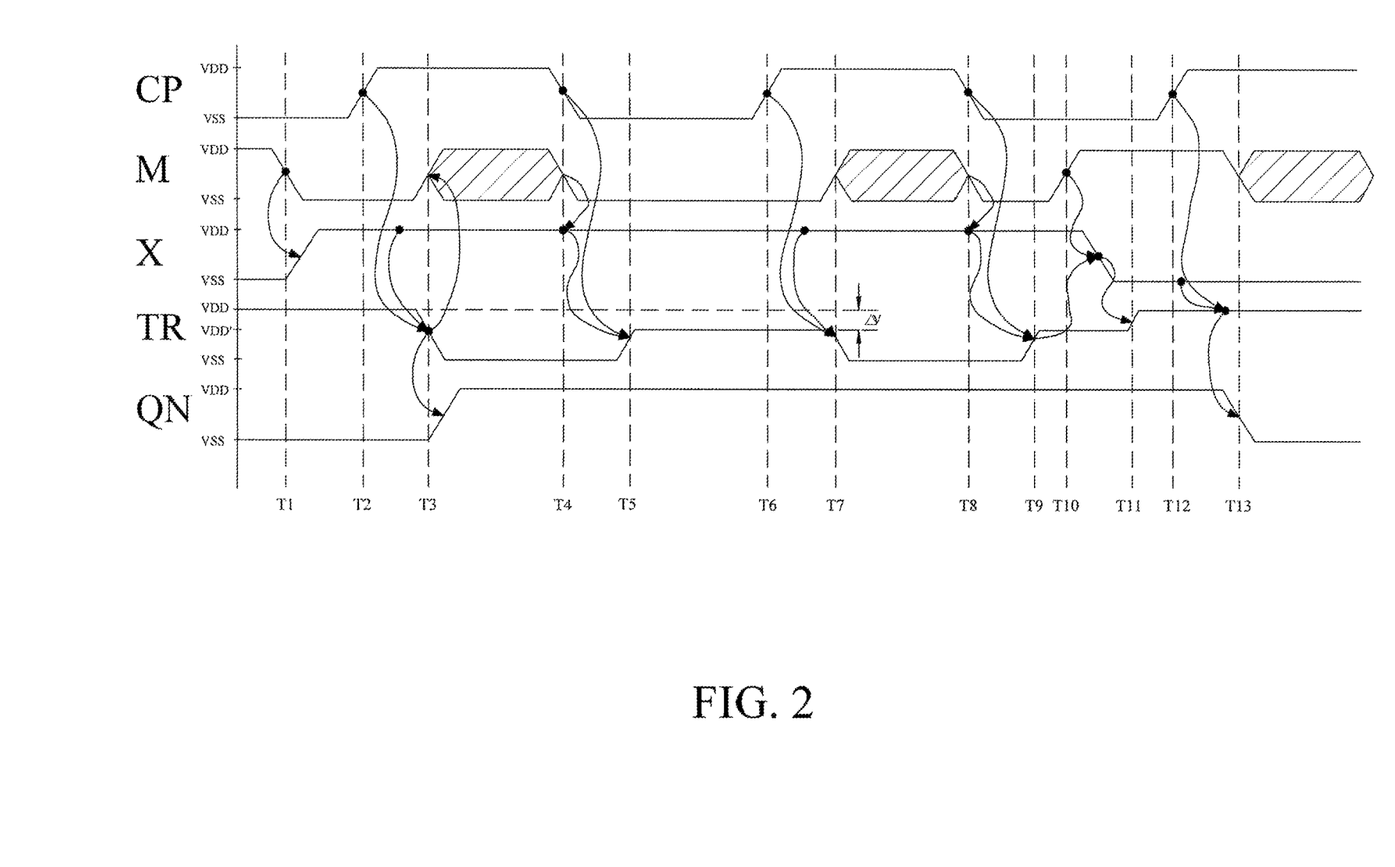
FIG. 2 is a timing diagram of signals at various nodes of the flip-flop circuit in FIG. 1 in accordance with some embodiments.

FIG. 2 is a timing diagram of signals at various nodes of the flip-flop circuit 100 in FIG. 1 in accordance with some embodiments. The elements of FIG. 1 are being used in conjunction with the waveforms in FIG. 2 for explaining the operation of flip-flop circuit 100. A voltage level VDD corresponds to the high logical value, and a voltage level VSS corresponds to the low voltage value. In the embodiment depicted in FIG. 2, voltage setting circuit VS is capable of setting signal TR to have a first voltage swing between voltage levels VDD and VSS or a second voltage swing between voltage levels VDD' and VSS. A voltage difference $\Delta V$ is between voltage level of VDD and voltage level VDD'. In some embodiments, voltage difference $\Delta V$ is set to be recognizable by AND gate A3 and NAND gate ND1 as corresponding to the high logical value.

At time T1, clock signal CP is logically low and signal TR is kept logically high due to the first state of clock signal CP, irrespective of the state of signal X. Signal M transitions from logically high to logically low based on signal D or signal SI. The output of first latch 120, signal X, is set to logically high based on signal TR, signal M, clock signal CP, and signal XB. Moreover, signal QN is kept at a currently stored value, assumed low.

At time T2, clock signal CP transitions from logically low to logically high. Signal X is already set to be logically high, and signal XB is thus pulled to logically low due to the logically high signal X. Signal TR, based on clock signal CP and signal X, is caused to be subsequently pulled low after time T2.

At time T3, signal TR transitions to logically low due to the logically high signals CP and X. Meanwhile, with signals TR and XB at logically low, signal X is held at the previously stored value (e.g., logically high), irrespective of the state of signal M. Furthermore, with signal TR pulled low, signal QN is subsequently pulled high after time T3. Voltage setting circuit VS is set to provide a reduced voltage level VDD' to NAND ND2.

Next, at time T4, clock signal CP transitions from high to low. At time T5, in response to the low logical value of clock signal CP and high logical value of signal X, signal TR is set to logically high, irrespective of the state of signal X. Because voltage setting circuit VS has been set to provide the reduced voltage level VDD' to NAND ND2, signal TR is pulled to the reduced voltage level VDD' rather than voltage level VDD.

Prior to time T6, signal M is set to logically low as the signal M from the previous cycle (i.e., at time T1). The output of first latch 120, signal X, remains at logically high and signal QN remains at a currently stored value, e.g., logically high.

At time T7, clock signal CP transitions to logically high. Signal X remains at logically high and signal XB remains at logically low. Trigger signal TR, based on clock signal CP and signal X, is caused to be subsequently pulled low after time T7. At time T8, clock signal CP transitions from high to low. At time T9, signal TR transitions to logically high due to the logically low signal CP and the logically high signal X. Signal QN remains at logically high. Because signal QN is still logically high, voltage setting circuit VS is still set to provide the reduced voltage level VDD' to NAND ND2, and signal TR is pulled to the reduced voltage level VDD' rather than voltage level VDD.

A time T10, signal M is set to logically high based on signal D or signal SI, which carries a different value than signal M at time period T1-T3 and T5-T7. The output of first latch 120, signal X, is set to logically low based on signal TR, signal M, clock signal CP, and signal XB. Meanwhile, signal QN is set at a currently stored value, which is logically high. At time T11, because signal X has a logical high value, signal TR is set to voltage level VDD regardless the state of signal QN.

At time T12, clock signal CP transitions to logically high. Signal X is already set to be logically low, and signal XB is thus pulled to logically high due to the logically low signal X. Signal TR, based on clock signal CP and signal X, remains at logically high after time T11. Because signal X has a logical low value, signal TR remains at the voltage level VDD.

At time T13, with signals TR and XB at logically high, signal X is held at the previously stored value (e.g., logically low), irrespective of the state of signal M. Furthermore, with signal TR at logically high, signal QN is pulled low at time T13. Voltage setting circuit VS is thus set to provide the voltage level VDD to the adjustable power node 142d of NAND ND2 rather than the reduced voltage level VDD'. Because signal X has a logical low value, signal TR remains at the voltage level VDD.

Figure 3A:
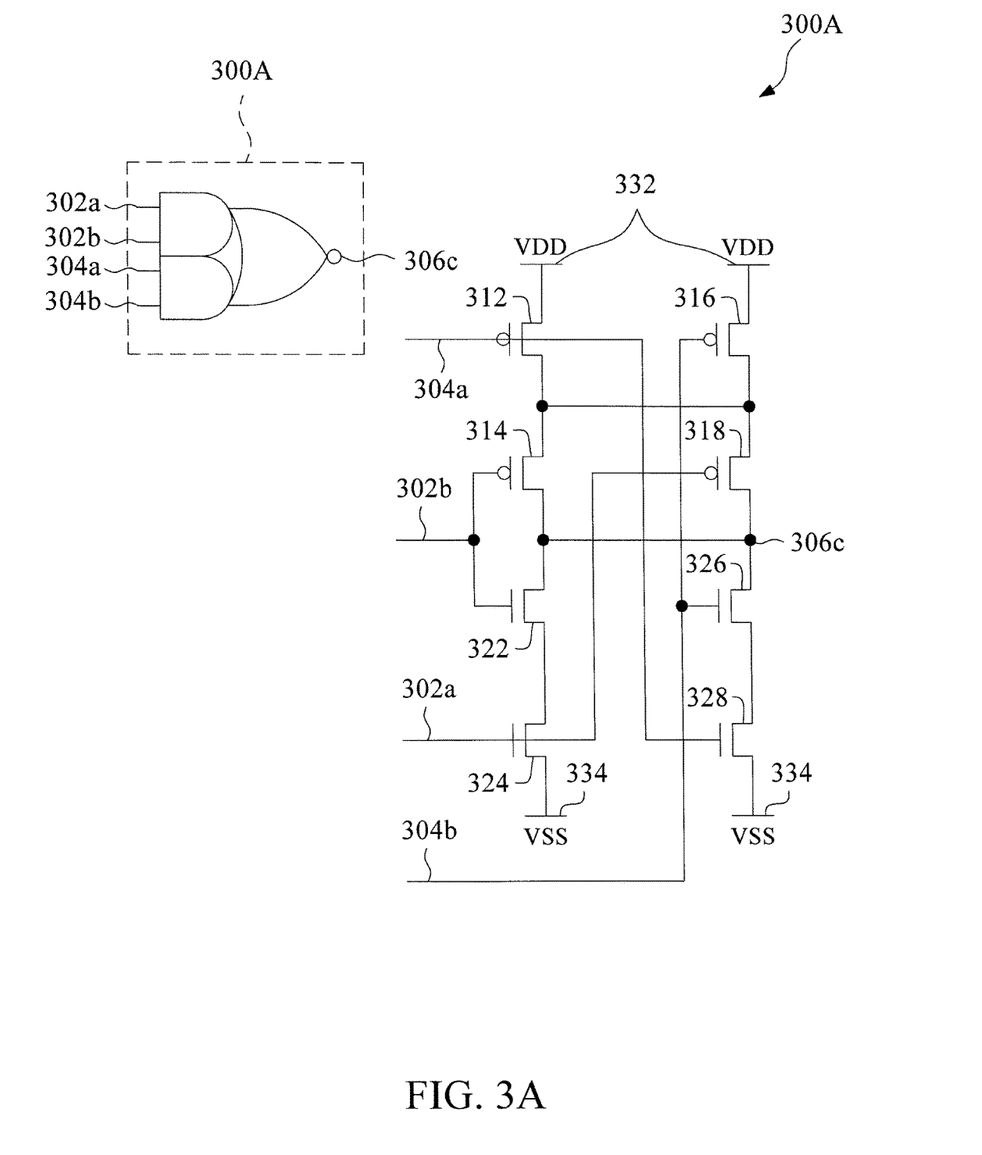
FIG. 3A is a circuit diagram of an example AND-OR-INV circuit in accordance with some embodiments.

FIG. 3A is a circuit diagram of an example AND-OR-INV (AOI) circuit 300A in accordance with some embodiments. AOI circuit 300A is usable as a compound logical gate for implementing AND gates A3 and A4 and NOR gate NR1. AOI circuit 300A has a first input 302a, a second input 302b, a third input 304a, a fourth input 304b, and an output 306c. In some embodiments, first input 302a corresponds to input 122a in FIG. 1; second input 302b corresponds to input 122b, third input 304a corresponds to input 124a, fourth input 304b corresponds to input 124b, and output 306c corresponds to output 126c.

AOI circuit 300A includes P-type transistors 312, 314, 316, and 318, and N-type transistors 322, 324, 326, and 328. P-type transistor 312 has a source coupled with a power supply node 332 configured to carry a power supply voltage having voltage level VDD. P-type transistor 312 has a drain coupled with a source of P-type transistor 314. P-type transistor 314 further has a drain coupled with output 306c. P-type transistor 316 has a source coupled with power supply node 332 and a drain coupled with a source of P-type transistor 318. P-type transistor 318 further has a drain coupled with output 306c. Drains of P-type transistor 312 and 316 are coupled together.

N-type transistor 324 has a source coupled with another power supply node 334 configured to carry a reference voltage having voltage level VSS. N-type transistor 324 has a drain coupled with a source of N-type transistor 322. N-type transistor 322 further has a drain coupled with output 306c. N-type transistor 328 has a source coupled with power supply node 334 and a drain coupled with a source of N-type transistor 326 N-type transistor 326 further has a drain coupled with output 306c.

Moreover, gates of transistors 318 and 324 are coupled with input 302a; gates of transistors 314 and 322 are coupled with input 302b; gates of transistors 312 and 328 are coupled with input 304a; and gates of transistors 316 and 326 are coupled with input 304b. In some embodiments, the configuration for nodes 302a and 302b are interchangeable. In some embodiments, the configuration for nodes 304a and 304b are interchangeable.

Figure 3B:
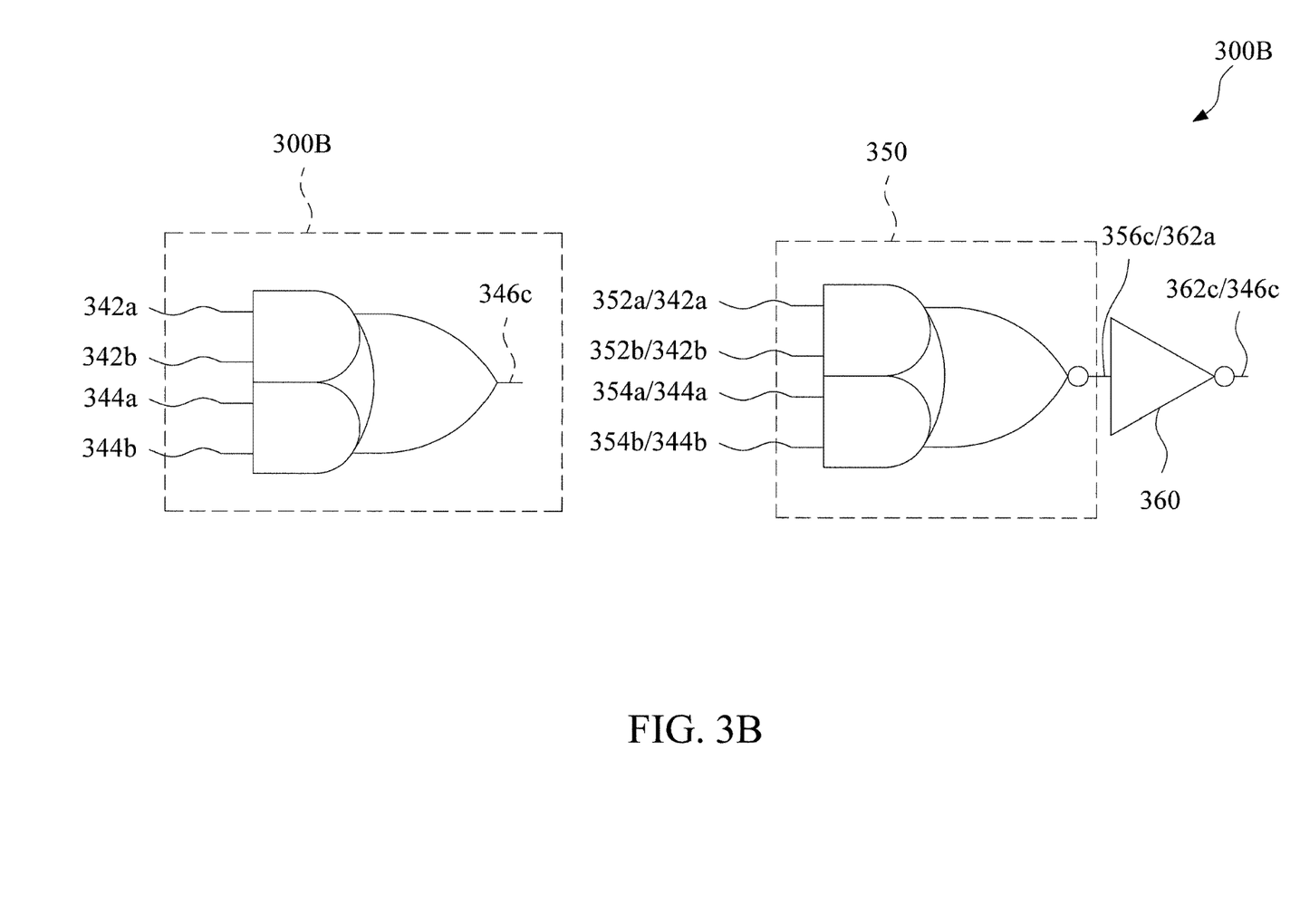
FIG. 3B is a circuit diagram of an example circuit usable as an input stage of the flip-flop circuit in FIG. 1 in accordance with some embodiments.

FIG. 3B is a circuit diagram of an example circuit 300B usable in an input stage 110 of the flip-flop circuit in FIG. 1 in accordance with some embodiments. Circuit 300B is usable as a compound logical gate for implementing AND gates A1 and A2 and OR gate O1. Circuit 300B has a first input 342a, a second input 342b, a third input 344a, a fourth input 344b, and an output 346c. In some embodiments, first input 342a corresponds to input 102a in FIG. 1; second input 342b corresponds to input 102b, third input 344a corresponds to input 104a, fourth input 344b corresponds to input 104b, and output 346c corresponds to output 106c.

Circuit 300B includes an AOI circuit 350 and an inverter 360. AOI circuit 350 corresponds to AOI circuit 300A and has a first input 352a, a second input 352b, a third input 354a, a fourth input 354b, and an output 356c. First input 352a corresponds to input 302a; second input 352b corresponds to input 302b; third input 354a corresponds to input 304a; and fourth input 354b corresponds to input 304b. First input 352a is usable as input 342a; second input 352b is usable as input 342b; third input 354a is usable as input 344a; and fourth input 354b is usable as input 344b.

Inverter 360 has an input 362a coupled with output 356c of AOI circuit 350. Inverter also has an output 362c usable as output 346c of circuit 300B.

Figure 4A:
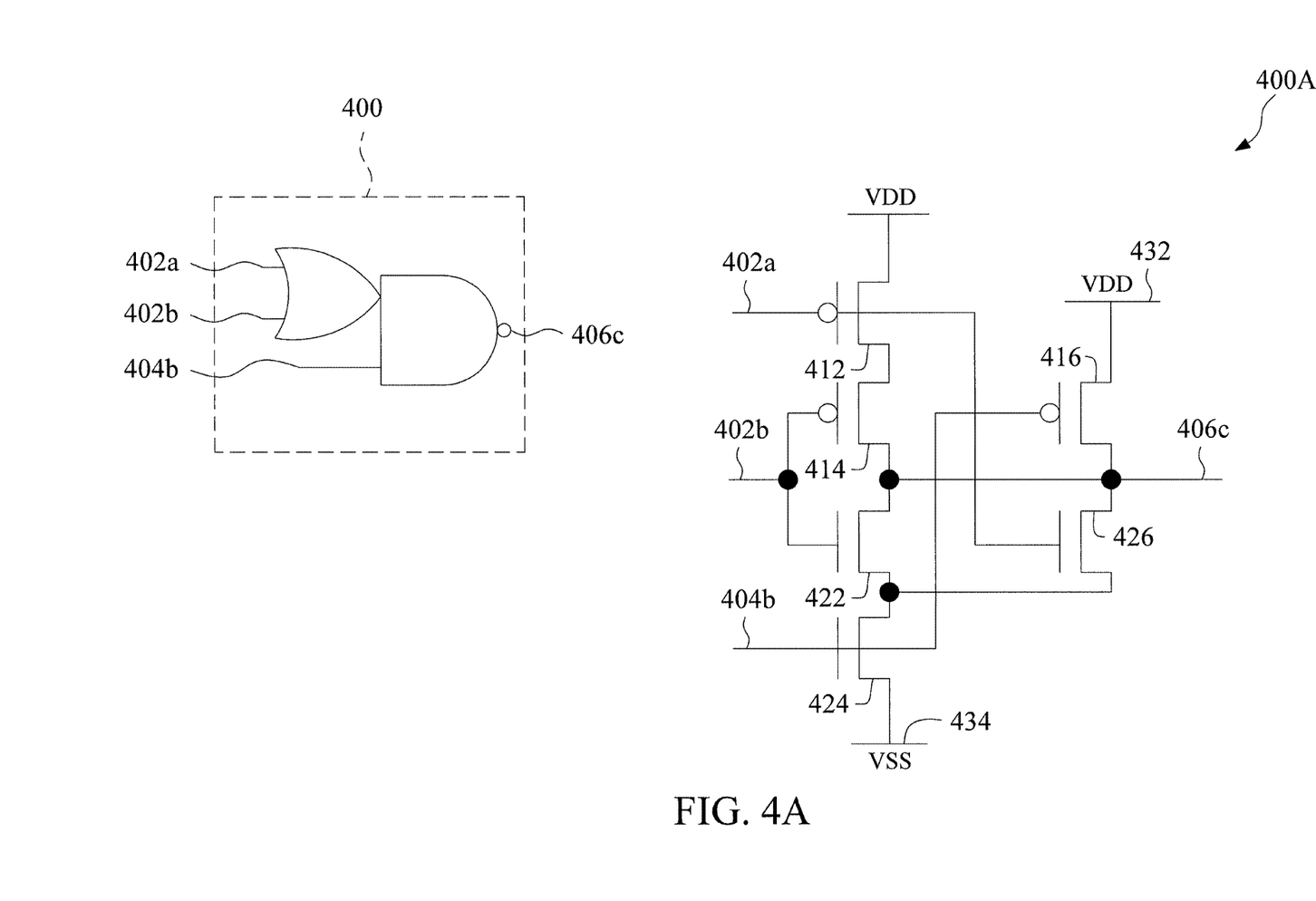
FIG. 4A is a circuit diagram of an example OR-AND-INV circuit in accordance with some embodiments.

FIG. 4A is a circuit diagram of an example OR-AND-INV (OAI) circuit 400A in accordance with some embodiments. OAI circuit 400A is usable as a compound logical gate 400 for implementing OR gate O2 and NAND gate ND1 in FIG. 1. OAI gate 400 has a first input 402a, a second input 402b, a third input 404b, and an output 406c. In some embodiments, first input 402a corresponds to input 132a in FIG. 1; second input 402b corresponds to input 132b, third input 404b corresponds to input 134b, and output 406c corresponds to output 134c.

OAI circuit 400A includes P-type transistors 412, 414, and 416, and N-type transistors 422, 424, and 426. P-type transistor 412 has a source coupled with a power supply node 432 configured to carry a power supply voltage having voltage level VDD. P-type transistor 412 has a drain coupled with a source of P-type transistor 414. P-type transistor 414 further has a drain coupled with output 406c. P-type transistor 416 has a source coupled with power supply node 432 and a drain coupled with output 406c.

N-type transistor 424 has a source coupled with another power supply node 434 configured to carry a reference voltage having voltage level VSS. N-type transistor 424 has a drain coupled with a source of N-type transistor 422. N-type transistor 422 further has a drain coupled with output 406c. N-type transistor 426 has a source coupled with the drain of N-type transistor 424. N-type transistor 426 has a drain coupled with output 406c.

Moreover, gates of transistors 412 and 426 are coupled with input 402a; gates of transistors 414 and 422 are coupled with input 402b; and gates of transistors 416 and 424 are coupled with input 404b. In some embodiments, the configuration for nodes 402a and 402b are interchangeable.

Figure 4B:
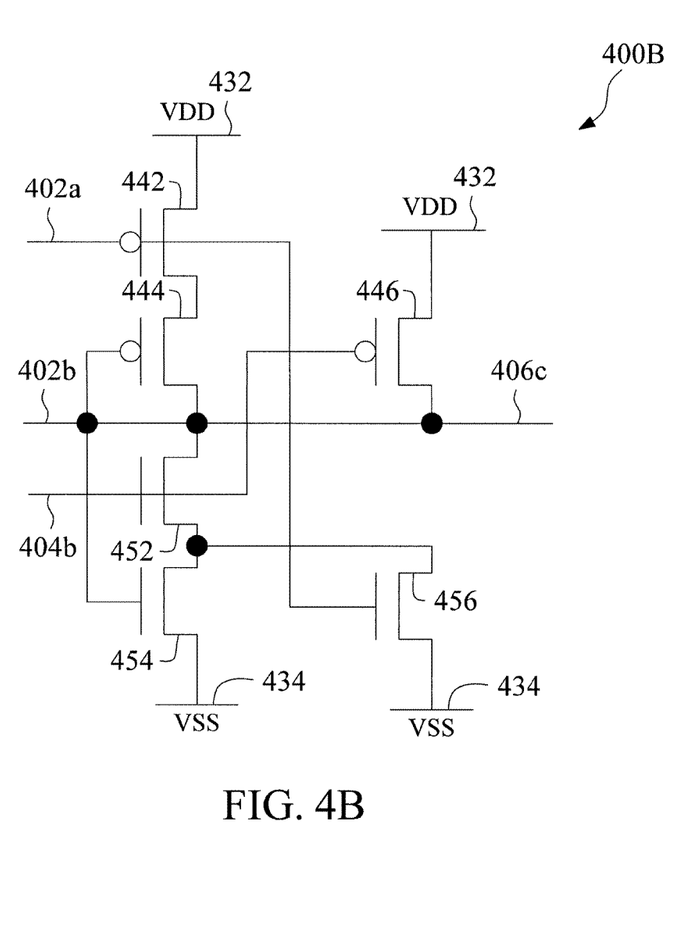
FIG. 4B is a circuit diagram of another example OR-AND-INV circuit in accordance with some embodiments.

FIG. 4B is a circuit diagram of another example OR-AND-INV circuit 400B in accordance with some embodiments. OAI circuit 400B is also usable as a compound logical gate 400 for implementing OR gate O2 and NAND gate ND1 in FIG. 1. OAI circuit 400B includes P-type transistors 442, 444, and 446, and N-type transistors 452, 454, and 456. P-type transistor 442 has a source coupled with power supply node 432 and a drain coupled with a source of P-type transistor 444. P-type transistor 444 further has a drain coupled with output 406c. P-type transistor 446 has a source coupled with power supply node 332 and a drain coupled with output 406c.

N-type transistor 454 has a source coupled with power supply node 434 and a drain coupled with a source of N-type transistor 452. N-type transistor 454 further has a drain coupled with output 406c. N-type transistor 456 has a source coupled with power supply node 334 and a drain coupled with the drain of N-type transistor 454.

Moreover, gates of transistors 442 and 456 are coupled with input 402a; gates of transistors 444 and 454 are coupled with input 402b; and gates of transistors 446 and 452 are coupled with input 404b. In some embodiments, the configuration for nodes 402a and 402b are interchangeable.

Figure 5:
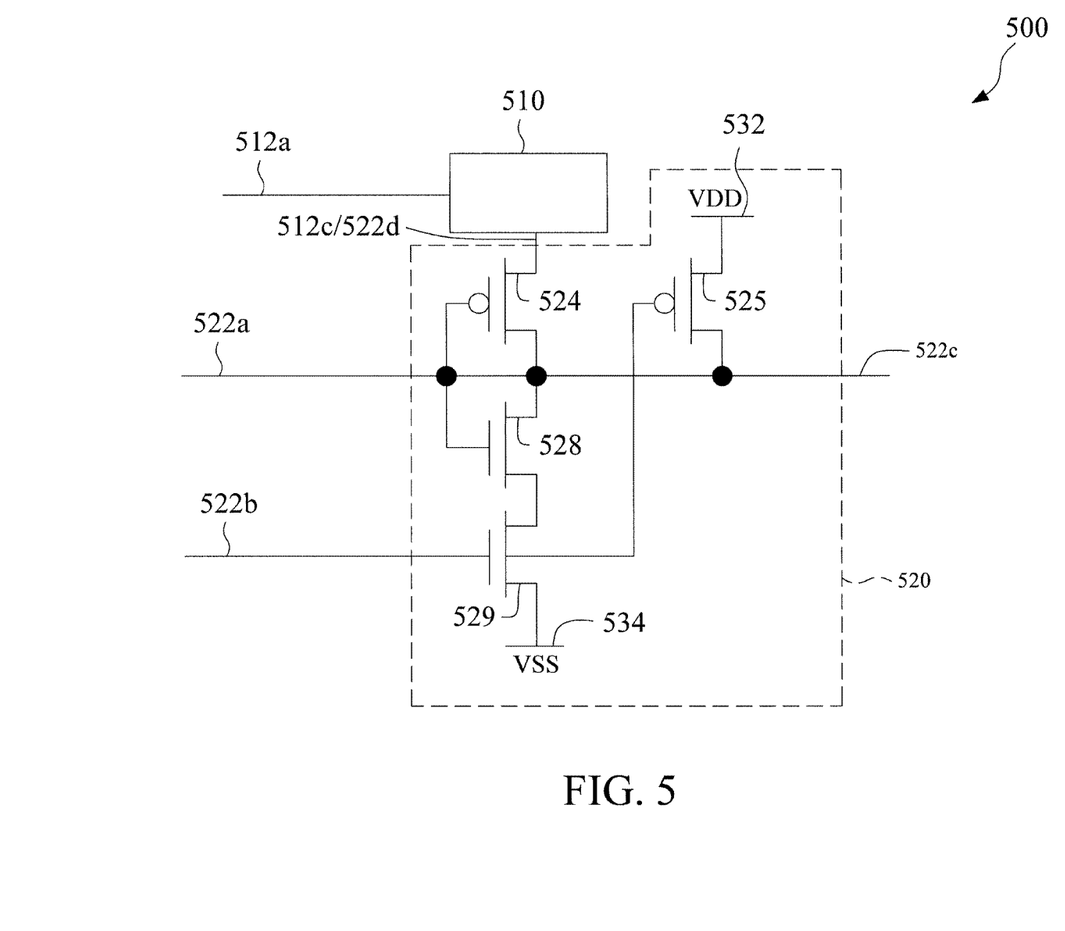
FIG. 5 is a circuit diagram of an example circuit usable as a trigger stage of the flip-flop circuit in FIG. 1 in accordance with some embodiments.

FIG. 5 is a circuit diagram of an example circuit 500 usable as a trigger stage 140 of the flip-flop circuit in FIG. 1 in accordance with some embodiments. Circuit 500 includes a voltage setting circuit 510 and a NAND gate 520. Voltage setting circuit 510 is usable as voltage setting circuit VS in FIG. 1, and NAND gate 520 is usable as NAND gate ND2.

Voltage setting circuit 510 includes an input node 512a and an output node 512c. In some embodiments, input node 512a is configured to receive signal QN from second latch 130. Voltage setting circuit 510 is configured to set a voltage at the output node 512c to have a first power supply voltage level, such as voltage level VDD, in response to the logically low state of signal QN at node 512a and to have a second power supply voltage level, such as voltage level VDD', in response to the logically high state of signal QN. Various implementations of voltage setting circuit will be further illustrated in conjunction with FIGS. 6A-6D.

NAND gate 520 includes inputs 522a and 522b, an output 522c, and a adjustable power node 522d. Power node 522d corresponds to adjustable power node 142d in FIG. 1 and is coupled with output node 512c of voltage setting circuit 510. Input 522a corresponds to input 142a; input 522b corresponds to input 142b; and output 522c corresponds to output 142c.

NAND gate 520 includes P-type transistors 524 and 525 and N-type transistors 528 and 529. P-type transistor 524 includes a source coupled with the power node 522d and a drain coupled with output 522c. P-type transistor 525 includes a source coupled with a power supply node 532 configured to carry a power supply voltage having voltage level VDD. P-type transistor 525 also includes a drain coupled with output 522c. N-type transistor 529 includes a source coupled with another power supply node 534 configured to carry a reference voltage having voltage level VSS. N-type transistor 529 also includes a drain coupled with a source of N-type transistor 528. N-type transistor 528 further includes a drain coupled with output 522c.

Moreover, gates of transistors 524 and 528 are coupled with input 522a; and gates of transistors 525 and 529 are coupled with input 522b.

Figure 6A:
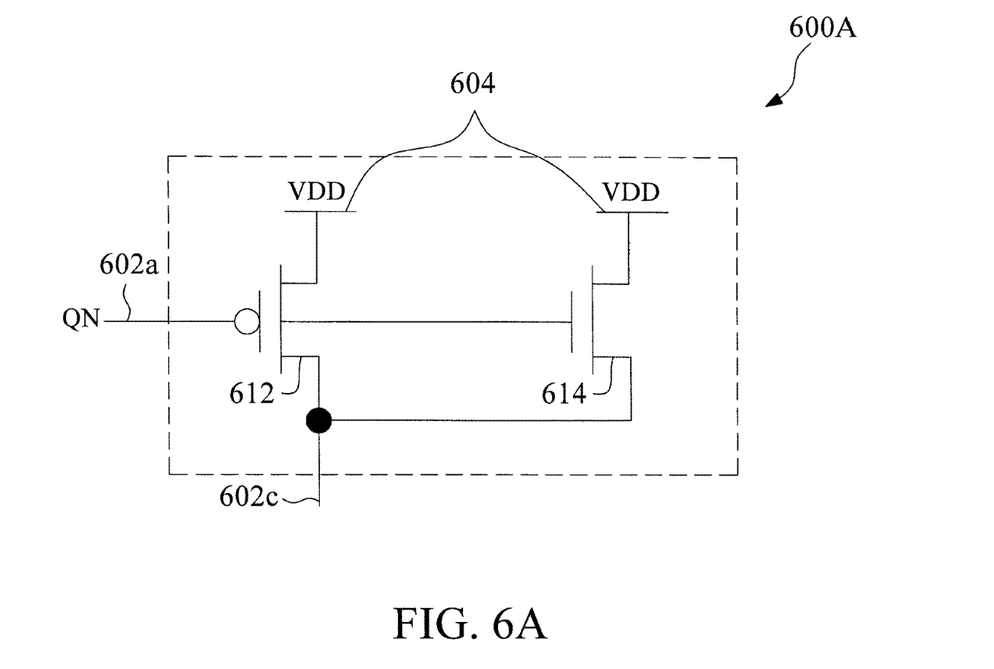
FIGS. 6A-6D are circuit diagrams of example circuits usable as a voltage setting circuit of the flip-flop circuit in FIG. 1 in accordance with some embodiments.

FIG. 6A is a circuit diagrams of an example circuit 600A usable as a voltage setting circuit VS of the flip-flop circuit in FIG. 1 or voltage setting circuit 510 in FIG. 5 in accordance with some embodiments.

Circuit 600A includes an input node 602a, an output node 602c, a power node 604 configured to carry a supply voltage having the power supply voltage level VDD, a P-type transistor 612, and an N-type transistor 614. In some embodiments, input node 602a corresponds to input node 512a in FIG. 5, output node 602c corresponds to output node 512c, and power node 604 corresponds to power supply node 532.

P-type transistor 612 includes a source coupled with power node 604 and a drain coupled with output node 602c. N-type transistor 614 includes a drain coupled with power node 604 and a source coupled with output node 602c. Gates of transistors 612 and 614 are coupled with input node 602a and are configured to receive a signal QN from second latch 130.

In operation, when signal QN at node 602a is logically low, transistor 612 is turned on and transistor 614 is turned off. Node 604 and node 602c are thus electrically coupled together, and node 602c output a voltage having a voltage level of VDD. When signal QN at node 602a is logically high, transistor 612 is turned off and transistor 614 is turned on. Node 602c is forced by N-type transistor 614 to have a voltage level of VDD-Vthn, where Vthn is the threshold voltage of N-type transistor 614. In some embodiments, the voltage level of VDD-Vthn is set to be still recognizable by AND gate A3 and NAND gate ND1 as corresponding to the high logical value.

Figure 6B:
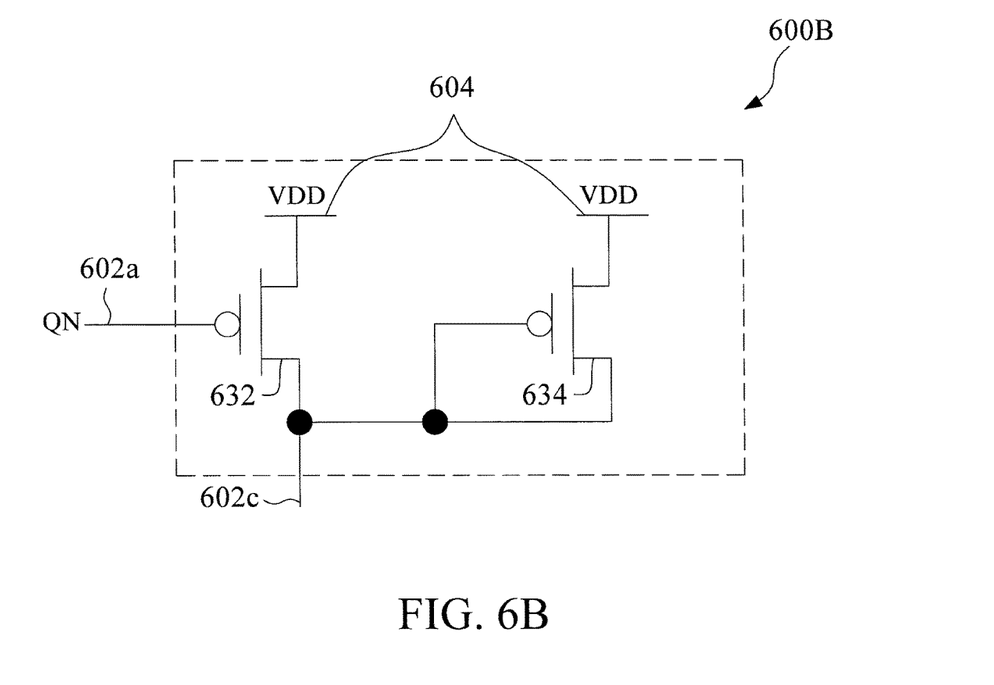

FIG. 6B is a circuit diagrams of another example circuit 600B usable as a voltage setting circuit VS of the flip-flop circuit in FIG. 1 or voltage setting circuit 510 in FIG. 5 in accordance with some embodiments. Components that are the same or similar to those in FIG. 6A are given the same reference numbers, and detailed description thereof is omitted.

Circuit 600B includes input node 602a, output node 602c, power node 604, and P-type transistors 632 and 634. P-type transistor 632 includes a source coupled with power node 604, a drain coupled with output node 602c, and a gate coupled with input node 602a and is configured to receive a signal QN from second latch 130. P-type transistor 634 includes a source coupled with power node 604, a drain coupled with output node 602c, and a gate coupled with output node 602c. Therefore, P-type transistor 634 is a diode-connected transistor having an anode coupled with power node 604 and a cathode coupled with output node 602c.

In operation, when signal QN at node 602a is logically low, transistor 632 is turned on. Node 604 and node 602c are thus electrically coupled together through transistor 632, and node 602c output a voltage having a voltage level of VDD. When signal QN at node 602a is logically high, transistor 632 is turned off. Node 602c is forced by the diode-connected transistor 634 to have a voltage level of VDD-Vthp, where Vthp is the threshold voltage of P-type transistor 634. In some embodiments, the voltage level of VDD-Vthp is set to be still recognizable by AND gate A3 and NAND gate ND1 as corresponding to the high logical value.

Figure 6C:
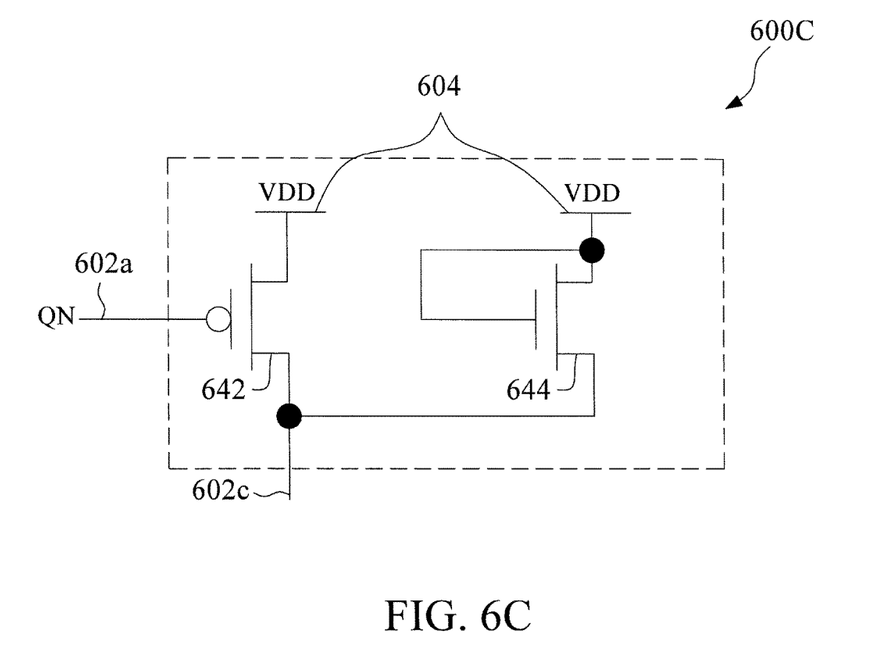

FIG. 6C is a circuit diagrams of another example circuit 600C usable as a voltage setting circuit VS of the flip-flop circuit in FIG. 1 or voltage setting circuit 510 in FIG. 5 in accordance with some embodiments. Components that are the same or similar to those in FIG. 6A are given the same reference numbers, and detailed description thereof is omitted.

Circuit 600C includes input node 602a, output node 602c, power node 604, a P-type transistor 642, and an N-type transistor 644. P-type transistor 642 includes a source coupled with power node 604, a drain coupled with output node 602c, and a gate coupled with input node 602a and is configured to receive a signal QN from second latch 130. N-type transistor 644 includes a drain coupled with power node 604, a source coupled with output node 602c, and a gate coupled with power node 604. Therefore, N-type transistor 644 is a diode-connected transistor having an anode coupled with power node 604 and a cathode coupled with output node 602c.

In operation, when signal QN at node 602a is logically low, transistor 642 is turned on. Node 604 and node 602c are thus electrically coupled together through transistor 642, and node 602c output a voltage having a voltage level of VDD. When signal QN at node 602a is logically high, transistor 642 is turned off. Node 602c is forced by the diode-connected transistor 644 to have a voltage level of VDD-Vthn, where Vthn is the threshold voltage of N-type transistor 644. In some embodiments, the voltage level of VDD-Vthn is set to be still recognizable by AND gate A3 and NAND gate ND1 as corresponding to the high logical value.

Figure 6D:
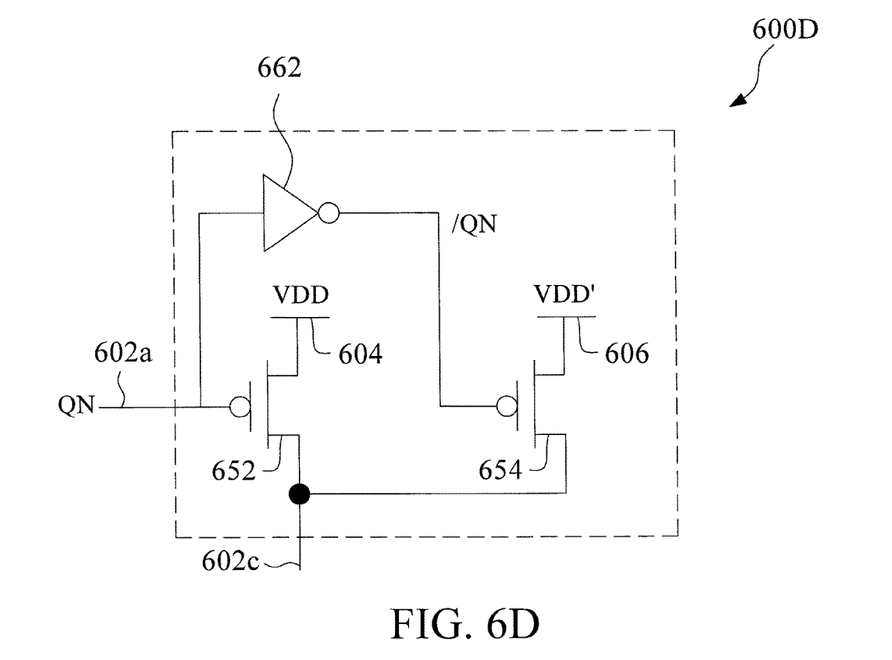

FIG. 6D is a circuit diagrams of another example circuit 600D usable as a voltage setting circuit VS of the flip-flop circuit in FIG. 1 or voltage setting circuit 510 in FIG. 5 in accordance with some embodiments. Components that are the same or similar to those in FIG. 6A are given the same reference numbers, and detailed description thereof is omitted.

Circuit 600D includes an input node 602a, an output node 602c, a first power node 604 configured to carry a supply voltage having the power supply voltage level VDD, and a second power node 606 configured to carry a supply voltage having the power supply voltage level VDD'. Circuit 600D further includes P-type transistors 652 and 654 and an inverter 662.

Inverter 662 includes an input and an output. The input of inverter 662 is coupled with input node 602a and is configured to receive a signal QN from second latch 130. The output of inverter 662 thus generates a signal/QN logically complementary to signal QN. P-type transistor 652 includes a source coupled with power node 604, a drain coupled with output node 602c, and a gate coupled with input node 602a. P-type transistor 654 includes a source coupled with power node 606, a drain coupled with output node 602c, and a gate coupled with the output of inverter 662. In some embodiments, P-type transistors 652 and 654 are replaced by other type of switching devices, such as other types of transistors or transmission gates.

In operation, when signal QN at node 602a is logically low, transistor 652 is turned on and transistor 654 is turned off. Node 604 and node 602c are thus electrically coupled together, and node 602c output a voltage having a voltage level of VDD. When signal QN at node 602a is logically high, transistor 652 is turned off and transistor 654 is turned on. Node 606 and node 602c are thus electrically coupled together, and node 602c output a voltage having a voltage level of VDD'. In some embodiments, the voltage level of VDD' is set to be still recognizable by AND gate A3 and NAND gate ND1 as corresponding to the high logical value.

Figure 7:
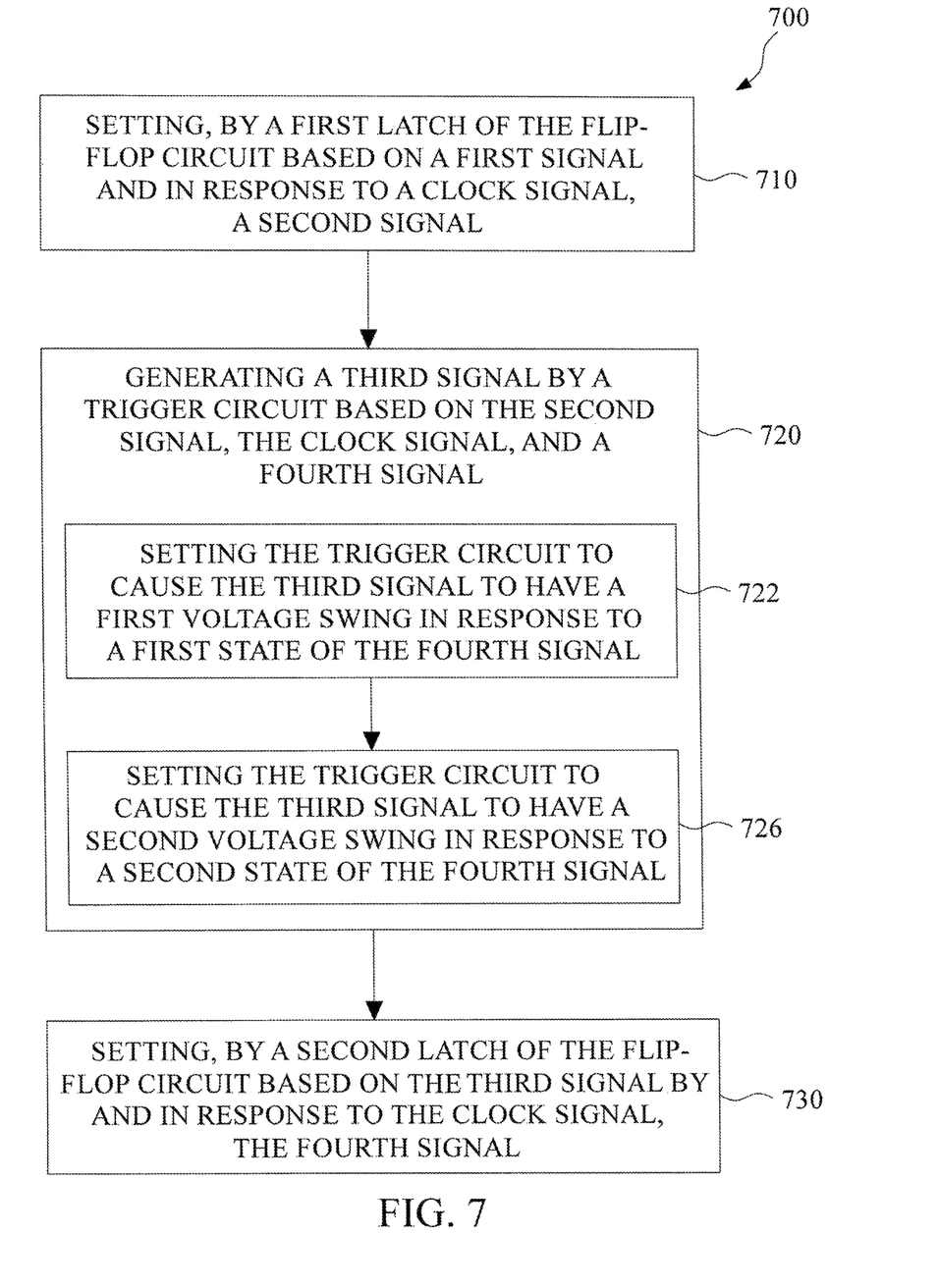
FIG. 7 is a flow chart of a method of operating a flip-flop circuit in accordance with some embodiments.

FIG. 7 is a flow chart of a method 700 of operating a flip-flop circuit, such as flip-flop circuit 100 in FIG. 1, in accordance with some embodiments. It is understood that additional operations may be performed before, during, and/or after the method 700 depicted in FIG. 7, and that some other processes may only be briefly described herein.

The method 700 begins with operation 710, where a first latch 120 of flip-flop circuit 100 sets a signal X based on signal M and in response to a clock signal CP. Then, in operation 720, a signal TR is generated by a trigger circuit, such as trigger stage 140, based on signal X, the clock signal CP, and a signal QN from a second latch 130. Finally, in operation 730, the second latch 130 sets signal QN based on signal TR and in response to the clock signal CP.

In some embodiments, operation 710 includes updating a logical state of signal X based on signal M in response to a low logical state of clock signal CP and holding the logical state of signal X in response to a high logical state of clock signal CP. In some embodiments, operation 730 includes updating a logical state of signal QN based on signal TR in response to the high logical state of clock signal CP and holding the logical state of signal QN in response to the low logical state of clock signal CP.

Moreover, operation 720 includes performing operation 722 and operation 726. In operation 722, trigger circuit 140 is set to cause signal TR to have a first voltage swing in response to a low logical state of signal QN. In operation 726, trigger circuit 140 is set to cause signal TR to have a second voltage swing in response to a high logical state of signal QN. In some embodiments, the second voltage swing is less than the first voltage swing. In some embodiments, operation 722 includes setting a voltage at an output node of a voltage setting circuit VC of the trigger circuit 140 to have a first power supply voltage level VDD in response to the first state of signal QN. In some embodiments, operation 726 includes setting a voltage at an output node of a voltage setting circuit VC of the trigger circuit 140 to have a second power supply voltage level VDD' in response to the second state of signal QN, where the second power supply voltage level VDD' is less than the first power supply voltage level VDD.

In accordance with one embodiment, a flip-flop circuit includes a first latch, a second latch, and a trigger circuit. The first latch is configured to set a first output signal based on a first input signal and a clock signal. The second latch is configured to set a second output signal based on a second input signal and the clock signal. The trigger circuit is coupled with the first latch and the second latch. The trigger circuit is configured to generate the second input signal based on at least the second output signal. The trigger circuit is configured to cause the second input signal to have different voltage swings based on the first output signal and the second output signal. The trigger circuit includes a logic circuit coupled to at least the first latch or the second latch. The logic circuit is configured to output the second output signal.

In accordance with another embodiment, a flip-flop circuit includes a first latch, a second latch, and a trigger circuit. The first latch configured to, based on a first signal and in response to a clock signal, generate a second signal. The trigger circuit coupled with the first latch and configured to generate a third signal based on at least a fourth signal. The trigger circuit comprising a logic gate circuit coupled to the first latch, and configured to output the third signal. The second latch coupled with the trigger circuit and configured to, based on the third signal and in response to the clock signal, generate the fourth signal.

In accordance with another embodiment, a method of operating a flip-flop circuit is disclosed. The method includes setting, by a first latch of the flip-flop circuit, a first latch output signal based on a first latch input signal and a clock signal; generating, by a trigger circuit, a second latch input signal based on at least the first latch output signal; and setting, by a second latch of the flip-flop circuit, the second latch output signal based on the second latch input signal and the clock signal. The generating the second latch input signal comprising setting the trigger circuit to cause the second latch input signal (TR) to have a first voltage swing or a second voltage swing based on at least a second latch output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A flip-flop circuit, comprising:
a first latch configured to set a first output signal based on at least a first input signal and a clock signal;
a second latch configured to set a second output signal based on a second input signal and the clock signal; and
a trigger circuit coupled with the first latch and the second latch, the trigger circuit being configured to generate the second input signal based on at least the second output signal, the trigger circuit being configured to cause the second input signal to have a first voltage swing or a second voltage swing based on the first output signal and the second output signal, the first voltage swing being different from the second voltage swing, the trigger circuit comprising:

a logic circuit coupled to at least the first latch or the second latch, and being configured to output the second input signal.

2. The flip-flop circuit of claim 1, wherein
the first latch comprises an AND-OR-INV compound logic gate comprising a first input node coupled to an output node of the trigger circuit, and being configured to receive the second input signal; and
the second latch comprises an OR-AND-INV compound logic gate comprising a second input node coupled to the output node of the trigger circuit, and being configured to receive the second input signal.

3. The flip-flop circuit of claim 1, wherein the trigger circuit is further configured to cause the second input signal to have:
the first voltage swing in response to a first state of the second output signal; and
the second voltage swing in response to a second state of the second output signal, the second voltage swing being less than the first voltage swing.

4. The flip-flop circuit of claim 3, wherein
the second voltage swing is greater than a threshold voltage of an N-type transistor of the first latch; or
the second voltage swing is greater than a threshold voltage of an N-type transistor of the second latch.

5. The flip-flop circuit of claim 1, wherein the logic circuit comprises a NAND gate comprising:
a first input node of the NAND gate being coupled to the first latch;
a second input node of the NAND gate being coupled to the second latch; and
an output node of the NAND gate.

6. The flip-flop circuit of claim 5, wherein the NAND gate further comprises:
a first P-type transistor comprising:
a gate configured to receive the clock signal;
a second P-type transistor comprising:
a drain coupled with a drain of the first P-type transistor; and
a gate configured to receive the first output signal;
a first N-type transistor comprising:
a drain coupled with the drain of the first P-type transistor and a drain of the second P-type transistor; and
a gate configured to receive the clock signal; and
a second N-type transistor comprising:
a drain coupled with a source of the first N-type transistor; and
a gate configured to receive the first output signal.

7. The flip-flop circuit of claim 1, wherein the trigger circuit further comprises:
a voltage setting circuit comprising an output node coupled to the logic circuit, the voltage setting circuit being configured to set a voltage at the output node to have:
a first power supply voltage level in response to a first state of the second output signal; and
a second power supply voltage level in response to a second state of the second output signal, the second power supply voltage level being less than the first power supply voltage level.

8. The flip-flop circuit of claim 7, wherein the voltage setting circuit further comprises:
a power node configured to carry a first supply voltage having the first power supply voltage level;
a P-type transistor having a source coupled with the power node, a gate configured to receive the second output signal, and a drain coupled with the output node of the voltage setting circuit; and
an N-type transistor having a drain coupled with the power node, a gate configured to receive the second output signal, and a source coupled with the output node of the voltage setting circuit and the drain of the P-type transistor.

9. The flip-flop circuit of claim 7, wherein the voltage setting circuit further comprises:
a power node configured to carry a first supply voltage having the first power supply voltage level;
a P-type transistor having a source coupled with the power node, a gate configured to receive the second output signal, and a drain coupled with the output node of the voltage setting circuit; and
a diode having an anode coupled with the power node, and a cathode coupled with the output node of the voltage setting circuit and the drain of the P-type transistor.

10. The flip-flop circuit of claim 7, wherein the voltage setting circuit further comprises:
a first power node configured to carry a first supply voltage having the first power supply voltage level;
a second power node configured to carry a second supply voltage having the second power supply voltage level;
a first switching device configured to electrically couple the first power node to the output node of the voltage setting circuit in response to the first state of the second output signal, and to electrically decouple the first power node from the output node of the voltage setting circuit in response to the second state of the second output signal;
a second switching device configured to electrically couple the second power node to the output node of the voltage setting circuit in response to the second state of the second output signal, and to electrically decouple the second power node from the output node of the voltage setting circuit in response to the first state of the second output signal; and
an inverter having an input node coupled to the first switching device, and an output node coupled to the second switching device.

11. The flip-flop circuit of claim 1, further comprising:
an input circuit coupled with the first latch, and being configured to output the first input signal based on one of a plurality of input signals.

12. A flip-flop circuit, comprising:
a first latch configured to, based on at least a first signal and in response to a clock signal, generate a second signal;
a trigger circuit coupled with the first latch and configured to generate a third signal based on at least a fourth signal, the third signal having a first voltage swing or a second voltage swing different from the first voltage swing, the trigger circuit comprising:
a logic gate circuit coupled to the first latch, and configured to output the third signal; and
a second latch coupled with the trigger circuit and configured to, based on the third signal and in response to the clock signal, generate the fourth signal.

13. The flip-flop circuit of claim 12, wherein the first latch comprises:
an AND-OR-INV compound logic gate comprising:
a first AND input node configured to receive the third signal, and coupled to an output node of the logic gate circuit;

a second AND input node configured to receive the first signal;
a third AND input node configured to receive the clock signal;
a fourth AND input node; and
a NOR output node configured to output the second signal; and
an inverter, comprising:
an input node coupled with the NOR output node of the AND-OR-INV compound logic gate, and being configured to receive the second signal; and
an output node coupled with the fourth AND input node of the AND-OR-INV compound logic gate, and being configured to invert the second signal.

14. The flip-flop circuit of claim 12, wherein the second latch comprises:
an OR-AND-INV compound logic gate comprising:
a first OR input node;
a second OR input node configured to receive the clock signal;
a first OR output node;
a first NAND input node configured to receive the third signal, and coupled to an output node of the logic gate circuit;
a second NAND input node coupled to the first OR output node; and
a NAND output node configured to output the fourth signal; and
an inverter, comprising:
an input node coupled with the NAND output node of the OR-AND-INV compound logic gate, and being configured to receive the fourth signal; and
an output node coupled with the first OR input node of the OR-AND-INV compound logic gate, and being configured to invert the fourth signal.

15. The flip-flop circuit of claim 12, wherein
the trigger circuit further comprises a voltage setting circuit comprising an output node, the voltage setting circuit configured to set a voltage at the output node in response to the fourth signal; and
the logic gate circuit comprises a power node electrically coupled with the output node of the voltage setting circuit.

16. The flip-flop circuit of claim 15, wherein the voltage setting circuit further comprises:
a power supply node configured to carry a first supply voltage having a first power supply voltage level;
a P-type transistor having a source coupled with the power supply node, a gate configured to receive the fourth signal, and a drain coupled with the output node of the voltage setting circuit; and
one of the following:
an N-type transistor having a drain coupled with the power supply node, a gate configured to receive the fourth signal, and a source coupled with the output node of the voltage setting circuit and the drain of the P-type transistor; or
a diode having an anode coupled with the power supply node, and a cathode coupled with the output node of the voltage setting circuit and the drain of the P-type transistor.

17. The flip-flop circuit of claim 15, wherein the voltage setting circuit further comprises:
a first power supply node configured to carry a first supply voltage having a first power supply voltage level;
a second power supply node configured to carry a second supply voltage having a second power supply voltage level;
a first switching device configured to electrically couple the first power supply node to the output node of the voltage setting circuit in response to a first logical state of the fourth signal, and to electrically decouple the first power supply node from the output node of the voltage setting circuit in response to a second logical state of the fourth signal;
a second switching device configured to electrically couple the second power supply node to the output node of the voltage setting circuit in response to a second logical state of the fourth signal, and to electrically decouple the second power supply node from the output node of the voltage setting circuit in response to the first logical state of the fourth signal; and
an inverter having an input node coupled to the first switching device, and an output node coupled to the second switching device.

18. A method of operating a flip-flop circuit, the method comprising:
setting, by a first latch of the flip-flop circuit, a first latch output signal based on at least a first latch input signal and a clock signal;
generating, by a trigger circuit, a second latch input signal based on at least the first latch output signal, the generating the second latch input signal comprising:
setting the trigger circuit to cause the second latch input signal to have a first voltage swing or a second voltage swing based on at least a second latch output signal,
the first voltage swing being different from the second voltage swing; and
setting, by a second latch of the flip-flop circuit, the second latch output signal based on the second latch input signal and the clock signal.

19. The method of claim 18, wherein the setting the trigger circuit to cause the second latch input signal to have the first voltage swing or the second voltage swing comprises:
causing the second latch input signal to have the first voltage swing in response to a first state of the second latch output signal; and
causing the second latch input signal to have the second voltage swing in response to a second state of the second latch output signal, the second voltage swing being less than the first voltage swing.

20. The method of claim 18, wherein the setting the trigger circuit comprises:
setting a voltage at an output node of a voltage setting circuit of the trigger circuit to have:
a first power supply voltage level in response to a first state of the second latch output signal; and
a second power supply voltage level in response to a second state of the second latch output signal, the second power supply voltage level being less than the first power supply voltage level.

* * * * *